United States Patent [19]
Chappelow et al.
[11] 3,892,606
[45] July 1, 1975

[54] METHOD FOR FORMING SILICON CONDUCTIVE LAYERS UTILIZING DIFFERENTIAL ETCHING RATES

[75] Inventors: Ronald E. Chappelow, Pleasant Valley; Donald A. Doney, Poughkeepsie; Joseph Doulin, Newburgh; Paul T. Lin, Wappingers Falls; Frank A. Schiavone, Marlboro, all of N.Y.

[73] Assignee: International Business Machines Corporation, Armonk, N.Y.

[22] Filed: June 28, 1973

[21] Appl. No.: 374,425

[52] U.S. Cl. .................... 148/174; 29/571; 29/591; 117/201; 117/212; 148/175; 156/6; 156/7; 156/17; 357/23; 357/56; 357/59; 357/68; 357/90

[51] Int. Cl. .......................... H011 7/50; H011 29/78

[58] Field of Search ...... 148/174, 175; 29/571, 591; 117/201, 212; 156/17; 317/234, 235; 357/23, 56, 59, 68, 90; 156/6, 7, 17

[56] References Cited

UNITED STATES PATENTS

| | | | |
|---|---|---|---|
| 3,586,922 | 6/1971 | Johnson et al. | 317/235 |
| 3,721,588 | 3/1973 | Hays | 148/175 |
| 3,738,880 | 6/1973 | Laker | 156/17 |
| 3,767,494 | 10/1973 | Muraoka et al. | 156/17 |
| 3,793,090 | 2/1974 | Barile et al. | 29/571 X |

OTHER PUBLICATIONS

Eversteyn et al., "Influence of $AsH_3$, $PH_3$ and $B_2H_6$–Mixture", M.S. 7428, Philips Research Lab, Eindhoven, Netherlands.

Bohg, A., "Ethylene–Etching Anomaly in Boron--Doped Silicon", J. Electrochem. Soc., Vol. 118, No. 2, Feb. 1971, pp. 401–402.

*Primary Examiner*—L. Dewayne Rutledge
*Assistant Examiner*—W. G. Saba
*Attorney, Agent, or Firm*—Thomas F. Galvin

[57] ABSTRACT

A method for forming contoured electrodes of polycrystalline silicon by grading the concentration of dopant diffused into the silicon layers during the deposition process. Upon etching the silicon after deposition to form electrodes, e.g., the gate electrode of a field effect transistor, the electrode is desirably tapered. Conductive and insulator layers subsequently deposited atop the tapered electrode are less subject to cracking and lifting off than standard electrodes.

14 Claims, 6 Drawing Figures

METHOD FOR FORMING SILICON CONDUCTIVE LAYERS UTILIZING DIFFERENTIAL ETCHING RATES

CROSS REFERENCE TO RELATED PATENT APPLICATION

Barile et al, Ser. No. 308,608 filed Nov. 21, 1972 and assigned to the same assignee as the present application is hereby incorporated by reference into this application.

BACKGROUND OF THE INVENTION

This invention relates to semiconductor devices which include the use of silicon as a conductor on the surface thereof. In particular, the invention relates to the formation of polycrystalline silicon electrodes in the fabrication of field effect transistors.

DESCRIPTION OF THE PRIOR ART

Modern manufacture of integrated circuits requires rather complex metallization configurations on the surface of the substrate over the active devices. Due to the tremendous advances in understanding chemical processing and transistor parameters, circuit density within the substrate has increased incredibly even compared to the density of a few years ago.

The increase in density within the substrate has also led to an increased density and complexity of the metallization and insulator layers applied on the surface of the substrate to form various interconnections between the active regions within the substrate and for connecting the devices to off chip voltage supplies and circuits.

The formation of these surface interconnections is difficult because there are substantial differences in thickness between the various coatings on the surface, resulting in substantial topological variations. These variations are evidenced as steps having severe gradations. Layers of insulation or metallization deposited over these sharply stepped areas have a tendency to crack and exhibit pinholes, and other discontinuities, increasing the probability of open circuits and the entrance of foreign material into lower layers. It has been recognized that gradually sloped surfaces in the layers atop the semiconductor substrate afford a solution to this problem. However, the formation of sloped surfaces is not easily accomplished.

In the formation of polycrystalline silicon conductive electrodes, which are substitutes for the usual aluminum or molybdenum electrodes on the semiconductor surfaces, the problem of severely stepped surfaces has not been heretofore solved. The problem is particularly evident in the fabrication of field effect transistors which utilize doped polycrystalline silicon as the gate electrode. The process usually involves the deposition of a blanket layer of silicon over the surface of the semiconductor after the gate insulation has been formed. The doped silicon is then selectively etched to form the gate electrode. After this step, a silicon dioxide insulation layer is applied over the silicon, contact holes are etched and an aluminum electrode layer is formed over the oxide to provide connections between the silicon gate electrode and other areas of the chip. At the sharply stepped edges of the silicon, the aluminum has a tendency to crack and form cusps, which result in abnormally thin regions, or even discontinuities in the aluminum conductor. There are similar, though not quite so severe, problems with the edge coverage of oxide. Significant yield losses in the manufacture of these devices results.

SUMMARY OF THE INVENTION

It is therefore an object of this invention to reduce stress cracks, cusps and other defects resulting from the fabrication of silicon conductive layers on the surface of semiconductor substrates.

It is a further object of this invention to provide a procedure whereby said silicon conductive electrodes may be fabricated with selected tapered shapes.

These and other objects of the present invention are achieved by varying the concentration level of the impurity dopant in the silicon layer. During the subsequent etching step, the doped silicon etches faster at the upper surface of the silicon than at the surface adjacent to the semiconductor substrate, thereby imparting a gradual slope to the side surfaces of the etched silicon.

In the preferred embodiment of the invention, the dopant is deposited at the same time as the silicon. The deposition mixture comprises $SiH_4$ and $B_2H_6$ and a carrier gas of $H_2$-$N_2$. During the deposition, the flow rate of $B_2H_6$ is controllably varied to reduce the doping level of the silicon layer at its upper surface compared to its lower surface. The etching rate of the moderately doped silicon at the upper surface is faster than that of the heavily doped silicon in the lower portion, resulting in a tapered silicon layer after etching.

DESCRIPTION OF THE PREFERRED EMBODIMENT

Figure 1:
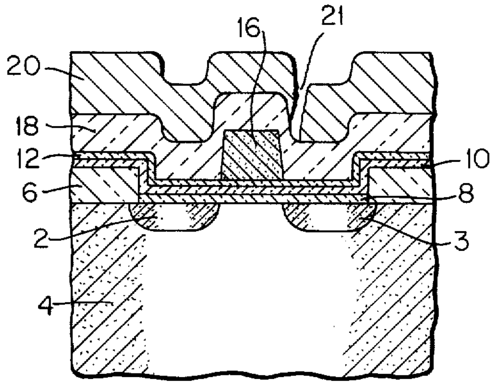
FIG. 1 (PRIOR ART)
FIGS. 1 and 2 are illustrations of devices showing defects attributable to sharply graded polycrystalline silicon electrodes.
Figure 2:
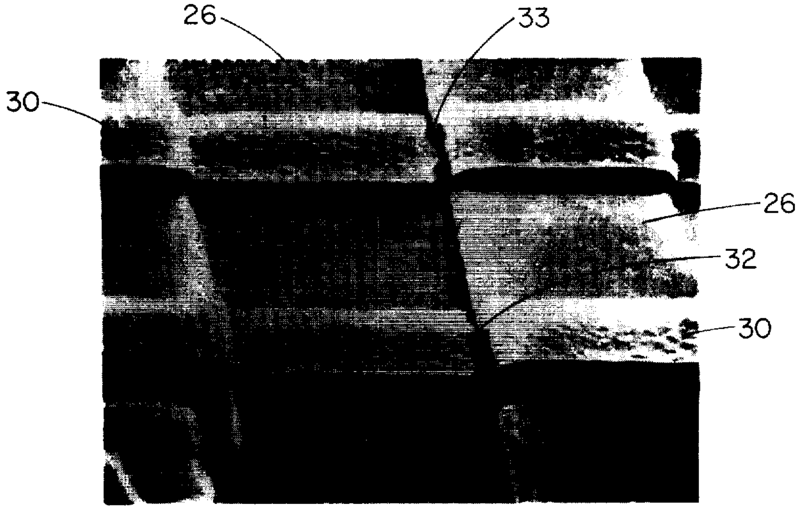

Referring now to FIGS. 1 and 2, the problems caused by the present methods of fabricating polycrystalline silicon electrodes are illustrated with respect to field effect transistors.

The process for forming the field effect transistors of FIGS. 1 and 2 and the structures obtained thereby form no part of the present invention. These processes and structures have already been described in great detail in an application by Barile et al entitled "Method for Stabilizing FET Devices Having Silicon Gates and Composite Nitride-Oxide Gate Dielectrics," Ser. No. 308,608, filed Nov. 21, 1972, now U.S. Pat. No. 3,793,090, issued Feb. 19, 1974, having the same assignee as the present invention. This application is hereby incorporated by reference for the sole purpose of providing a background to those of skill in this art. It will also be understood that the present invention is in no way limited to field effect transistors but it is generally applicable to any device utilizing patterned silicon as a conductive electrode.

In FIGS. 1 and 2 semiconductor substrate 4 is typically N type silicon in the <100> crystallographic orientation having source and drain regions graphic orientation having source and drain regions 2 and 3, respectively, diffused thereon. Thick oxide layer 6 and a composite layer of silicon dioxide 8 and silicon nitride 10 are disposed atop substrate 4. Layer 12 is a complex layer formed by annealing the nitride layer 10 in oxygen. Disposed on the surface of layer 12 and intermediate the source and drain regions is polycrystalline silicon electrode 16. Electrode 16 is commonly formed by decomposing silane ($SiH_4$) in a carrier of $H_2$ at around 800°C or in $H_2$ and $N_2$ in the temperature range of 600°–850°C to form a blanket layer. Electrode 16 is made conductive by doping it with a P type impurity such as boron. The boron is deposited in a gas comprising, for example, $BBr_3$ or $B_2H_6$ to achieve a doping level of around $10^{19}$ /cm$^3$. The doping of the electrode 16 with boron in prior art processes may be accomplished during the deposition of the silicon or in a separate step. The latter process is preferred.

Subsequent to the formation of the doped polycrystalline silicon blanket layer, patterned electrode 16 is formed by a conventional masking and etching step. The same diffusion which makes the polycrystalline silicon conductive is commonly used to form source and drain regions 2 and 3.

What has been described up to this point is a self-aligned gate process where the gate electrode is patterned, and the source and drain regions are subsequently formed in substrate 4 using electrode 16 as a mask. With the exception of the formation of layer 12, which is the subject of the above referenced related patent application, this process and structure is known to those of skill in the art. Subsequent to the formation of the field effect transistor, insulator layer 18 of around 6,000A thickness is deposited over the entire substrate and then patterned for the purpose of masking subsequent contact to electrode 16.

After oxide layer 18 has been patterned, a blanked layer 20 of Al-Cu metallization is evaporated over the device. Patterning of layer 20 is accomplished by a conventional subtractive etching technique. We have found that in using the standard process for fabricating the silicon electrode metallization layer 20 formed over electrode 16 exhibits stress cracks and fissures which result in an unacceptable device. One such fissure 21 is illustrated in FIG. 1. This type of break has been found to be due to the sharp slope of layer 16. It is believed that the sharp slope contributes to greater stress in the subsequently deposited layers, thereby causing cracks and breaks in a certain percentage of devices. In addition, it can be seen in FIG. 1 that the topology of the structure itself results in the sidewalls of layer 18 being covered with less electrode material than on the other areas of the surface The gravity of this problem is illustrated in FIG. 2 which is a surface view of a field effect transistor integrated circuit utilizing polycrystalline silicon as the electrode. In this view, contact is to be made directly from silicon 26 and aluminum electrodes 30 which are disposed in an orthogonal direction with respect to the direction of silicon electrodes 26. This figure is adapted from a scanning electron microscope photograph of an actual production device. The complete discontinuity of aluminum electrodes 30 at the sloped portion of polysilicon electrode 26 is evident in the drawing at locations 32 and 33. The device is obviously unacceptable and represents a substantial waste of money, occuring as it does near the end of the complicated integrated circuit manufacturing process.

There are other problems associated with the sharply sloped electrode. In FIG. 2 it can be seen that the discontinuity is extremely ragged. Another defect not illustrated in the drawings occurs in electrodes which are not completely discontinuous at the sloped areas of electrode 26. Metal lands 30 show a tendency to "undercut" at the slopes, resulting in higher current densities in these areas due to less electrode material being available to carry current.

Figure 3:
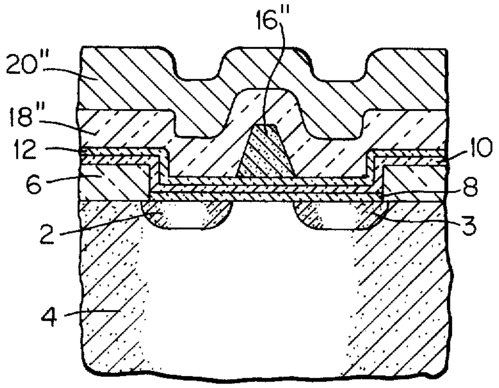
FIG. 3 is a schematic drawing of the desirable tapered electrode which results from our inventive method.

FIG. 3 illustrates the tapered structure which is achieved by our inventive process. As stated previously, others had suggested that tapered structures should yield fewer reliability problems, although we are unaware of any specific publication or patent which discusses the need with respect to the silicon electrodes. Heretofore, however, neither a process for forming a tapered silicon electrode nor the structure itself had been developed.

A tapered electrode 16'' illustrated in FIG. 3 is formed first by varying the doping level of the impurity dopant in the polycrystalline silicon blanket layer and then etching the layer in the usual way. The etch rate of the silicon varies as a function of the doping level in the silicon layer and, with proper doping, more material can be removed at the upper surface of the electrode than at the lower surface.

As a result of the tapered structure 16'', no discontinuity of oxide layers 18'' or metal lands 20'' is found in actual production lots of devices.

Figure 4:
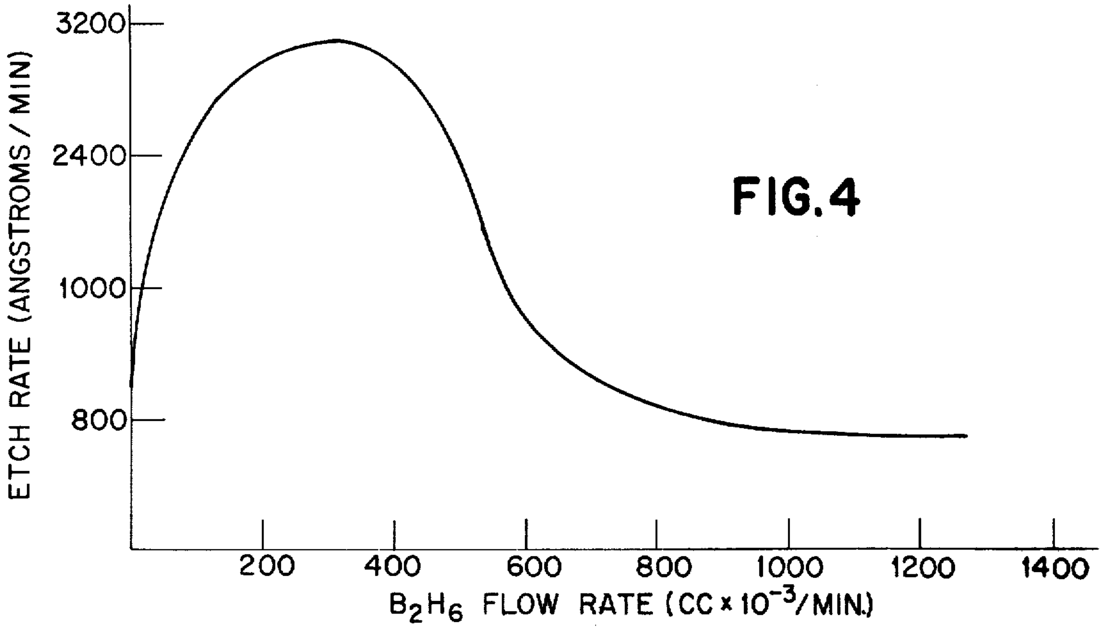
FIG. 4 is a graph of the etching rate of polycrystalline silicon versus the flow rate of diborane ($B_2H_6$).

FIG. 4 illustrates the variation in etching rate of boron-doped polycrystalline silicon as a function of the flow rate of diborane, $B_2H_6$ in the reactor. It is seen that the etching variation is smooth and continuous for a range between around 0.1 cc/min to 1.2 cc/min. In the actual process for producing the tapered electrode, 5 cc/min of $SiH_4$, 60 standard liters/min of $H_2$ and $B_2H_6$ in varying quantities are mixed in a barrel reactor. The semiconductor substrates on which the silicon was deposited is heated to 810°C. The deposition process takes 10 minutes, resulting in the deposition of a 7000A blanket layer of silicon. The flow rate of $B_2H_6$ is varied during the ten minute duration from a maximum of 0.8 cc/min. at the beginning of the deposition process to 0.25 cc/min. at the end of the duration. The change in flow rate is gradual and continuous, thereby yielding silicon heavily doped with boron in the area adjacent the gate insulator and most lightly doped at the upper surface of the electrode.

Figure 5:
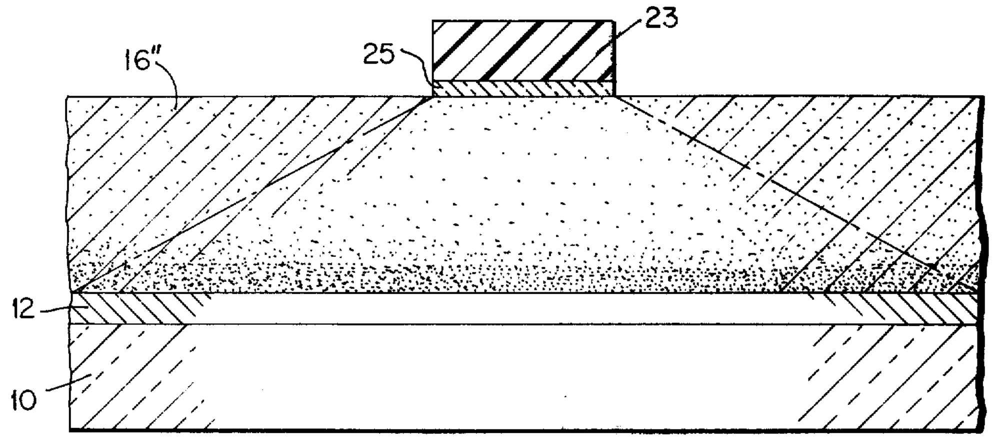
FIG. 5 is a schematic cross-sectional representation of the impurity profile within a silicon layer prior to the etching step which forms the tapered electrode.

FIG. 5 illustrates the relative doping levels of blanket silicon layer 16'' after the deposition step has been completed but before etching. As illustrated, a photoresist mask 23 and 700A of $SiO_2$ 25 cover the portion of the electrode which is not to be etched. The contour lines stippled in a layer 16'' indicate the gradual decrease of doping level nearer the surface of the electrode. The two dashed lines within electrode 16'' indicate the approximate tapered shape achieved after etching. The drawing in FIG. 5 is not to scale. As will be evident to those of skill in the semiconductor art, the depth of layer 16'' is greatly magnified in comparison with its length.

The etching of electrode 16'' is accomplished in a mixture of: 50 cc HF, 1300 cc $HNO_3$ and 1650 cc HAC (acetic acid). This particular mixture is quite conventional and forms no part of our invention.

As can be seen by scrutinizing the curve in FIG. 4, an alternative process would have been to vary the flow rate from around 0.05 cc/min. to 0.25 cc/min. to achieve a similar result. However, since the silicon is to be a conductive electrode, it is desired to achieve a high doping. Thus, it is preferred to achieve as high a concentration as possible during the dopant deposition step and this is accomplished by selecting a high flow rate of diborane.

The deposition of layer 16'' with a graded impurity profile may be accomplished in any standard reactor system; and although it is preferably by chemical vapor deposition, other processes such as evaporation could be used. In addition, other dopants besides P type boron could be used, such as phosphorus which is N type, since the etch rate of silicon also varies with the impurity concentration of phosphorus. Another N type impurity which might be diffused is arsenic. However, this is extremely difficult to accomplish with arsine, $AsH_3$, because of the tendency of As to exist in the gaseous state rather than in solid combination with silicon in a reactor.

Figure 6:
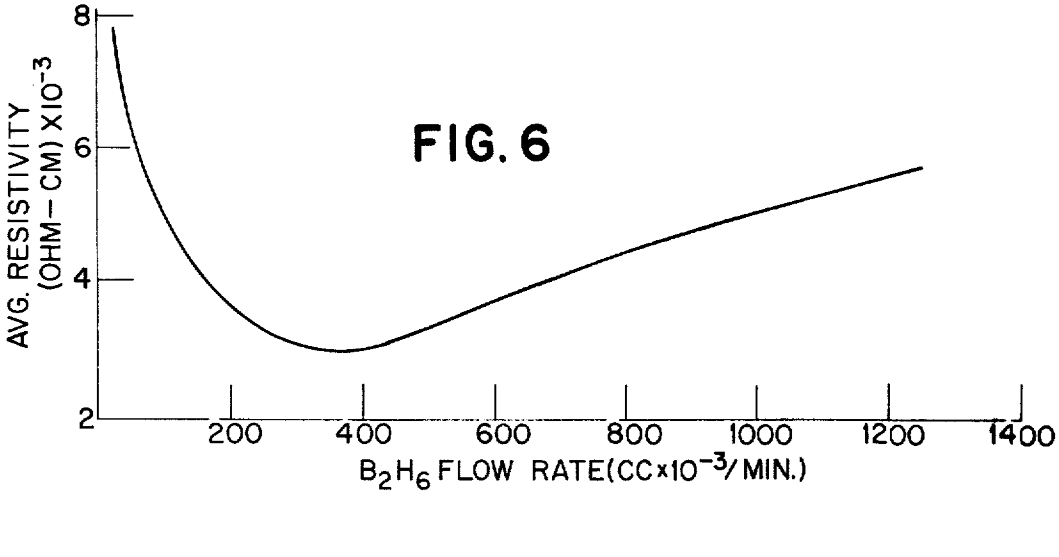
FIG. 6 is a graph of the average resistivity of silicon versus the flow rate of $B_2H_6$.

One drawback associated with the tapered electrode and graded doping of the present invention is the higher resistivity of the electrode as compared to the non-tapered shape. As will be appreciated from comparing the electrodes of FIG. 1 and FIG. 3: for a given depth of the initial blanket layer of polycrystalline silicon and mask area, there is less material in the tapered electrode after etching than the standard electrode. In addition, we have found that the resistivity of a polysilicon electrode exhibits an anomalous variation as compared to the flow rate of the diborane dopant. This is illustrated in FIG. 6 where it is seen that the resistivity reaches a minima at around 0.3 cc/min. and then increases with increased flow rate rather than decreasing as might be expected. These two factors of reduced conductive material in a tapered electrode and an increased resistivity for higher doping levels must be taken into account when the size of the electrode is designed. For example, a larger mask could be used or a thicker electrode could be deposited. In addition, the conductivity of the silicon can be further increased in a subsequent step. For example, in the formation of the source and drain regions by the diffusion of boron, the silicon electrode is unmasked to allow the boron to diffuse into it as well as the source and drain regions.

Although the invention has been described with a certain degree of particularity, it is understood that the present disclosure has been made only by way of example and that numerous changes in the details of construction, the combination and arrangement of parts, and the method of operation may be made without departing from the spirit and scope of the invention as hereinafter claimed.

For example, the particular silicon deposition process described herein is pyrolytic decomposition of $SiH_4$ in $H_2$-$N_2$ diluent. However, other processes well known in the literature are compatible with our inventive method. In addition, although the decomposition process has been set forth using specific flow rates of the gaseous constituents, a wide range is available. Again, these ranges are well known to those of skill in the art.

What is claimed is:

1. A method for fabricating a silicon electrode atop a substrate, said electrode having a gradual slope at the sides thereof, so that the area encompassed by the electrode at the substrate is larger than the area at the opposite surface of said electrode, comprising the steps of:
   - varying the concentration gradient of boron dopant impurity of said silicon electrode such that the dopant concentration decreases from the substrate outward toward the opposite surface; and
   - etching said doped electrode in a mixture of HF, $HNO_3$ and acetic acid, the etch rate of said electrode material being a function of impurity concentration, thereby achieving said sloped pattern.

2. A method as in claim 1 wherein said impurity is deposited simultaneously with the deposition of said silicon.

3. A method as in claim 2 wherein said silicon is deposited by the pyrolytic decomposition of silane and said dopant is derived from diborane gas.

4. A method as in claim 3 wherein the flow rate of said diborane gas is varied continuously during the deposition cycle to achieve said varied concentration gradient.

5. In the fabrication of an insulated gate field effect transistor, a method for forming a polycrystalline silicon gate electrode which is tapered so that the area encompassed by the electrode at the substrate is larger than the area at the opposite surface of said electrode comprising the steps of:
   - varying the concentration gradient of boron dopant impurity diffused in a layer of polycrystalline silicon such that the dopant concentration decreases from the substrate outward toward the opposite surface;
   - masking said layer in areas where said tapered electrode is to be formed; and
   - etching said doped layer in a mixture of HF, $HNO_3$ and acetic acid, the etch rate of said electrode material being a function of impurity concentration, thereby achieving said tapered electrode.

6. A method as in claim 5 wherein said dopant impurity is deposited simultaneously with the formation of said polycrystalline silicon layer.

7. A method as in claim 6 wherein said silicon is deposited by the pyrolytic decomposition of silane and said dopant is derived from diborane gas.

8. A method as in claim 7 wherein the flow rate of said diborane gas is varied from around 0.8 cc/min. at the beginning of the silicon deposition cycle and is gradually decreased to around 0.25 cc/min. at the end of said cycle, the flow rate of said silane remaining constant at 5 cc/min. in a diluent gas of hydrogen.

9. A method as in claim 4 wherein the flow rate of said diborane gas is varied from around 0.05 cc/min. at the beginning of the silicon deposition cycle and is gradually increased to around 0.25 cc/min. at the end of said cycle, the flow rate of said silane remaining constant at 5 cc/min. in a diluent gas of hydrogen; and further comprising the step of:
   - diffusing boron into said electrode after the completion of said etching step whereby the conductivity of the electrode is increased.

10. A method as in claim 4 wherein the flow rate of said diborane gas is varied from around 0.8 cc/min. at the beginning of the silicon deposition cycle and is gradually decreased to around 0.25 cc/min. at the end of said cycle, the flow rate of said silane remaining constant at 5 cc/min. in a diluent gas of hydrogen.

11. A method as in claim 10 and further comprising the step of:

diffusing boron into said electrode after the completion of said etching step, whereby the conductivity of the electrode is increased.

12. A method as in claim 7 wherein the flow rate of said diborane gas is varied from around 0.05 cc/min. at the beginning of the silicon deposition cycle and is gradually increased to around 0.25 cc/min. at the end of said cycle, the flow rate of said silane remaining constant at 5 cc/min. in a diluent gas of hydrogen; and further comprising the step of:

diffusing boron into said electrode after the completion of said etching step whereby the conductivity of the electrode is increased.

13. A method as in claim 7 wherein the flow rate of said diborane gas is varied from around 0.8 cc/min. at the beginning of the silicon deposition cycle and is gradually decreased to around 0.25 cc/min. at the end of said cycle, the flow rate of said silane remaining constant at 5 cc/min. in a diluent gas of hydrogen.

14. A method as in claim 13 and further comprising the step of:

diffusing boron into said silicon after the step of etching said doped layer, thereby increasing the conductivity of said silicon electrode.

* * * * *